US012295167B2

(12) United States Patent
Cheng

(10) Patent No.: US 12,295,167 B2
(45) Date of Patent: May 6, 2025

(54) DIODE AND MANUFACTURING METHOD THEREFOR

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 442 days.

(21) Appl. No.: 17/779,115

(22) PCT Filed: Oct. 30, 2020

(86) PCT No.: PCT/CN2020/125419
§ 371 (c)(1),
(2) Date: May 23, 2022

(87) PCT Pub. No.: WO2021/139362
PCT Pub. Date: Jul. 15, 2021

(65) Prior Publication Data
US 2022/0406949 A1    Dec. 22, 2022

(30) Foreign Application Priority Data
Jan. 10, 2020  (CN) .......................... 202020055063.8

(51) Int. Cl.
*H01L 23/31*      (2006.01)
*H01L 21/02*      (2006.01)
(Continued)

(52) U.S. Cl.
CPC ......... *H10D 8/60* (2025.01); *H01L 21/02241* (2013.01); *H01L 23/3171* (2013.01);
(Continued)

(58) Field of Classification Search
CPC ............... H01L 21/02241; H01L 21/02; H01L 21/02458; H01L 21/265; H01L 21/845;
(Continued)

(56) References Cited

U.S. PATENT DOCUMENTS 7,687,290 B2 *   3/2010   Abe .................. B82Y 20/00
                                                  438/31
2008/0233668 A1 *  9/2008   Abe .................. H01S 5/028
                                                  438/31

FOREIGN PATENT DOCUMENTS

CN    101051613 A    10/2007
CN    102184972 A    9/2011
(Continued)

OTHER PUBLICATIONS

ISA State Intellectual Property Office of the People's Republic of China, International Search Report Issued in Application No. PCT/CN2020/125419, Jan. 27, 2021, WIPO, 4 pages.
(Continued)

*Primary Examiner* — Nikolay K Yushin
(74) *Attorney, Agent, or Firm* — The Small Patent Law Group LLC; Christopher R. Carroll

(57) ABSTRACT

Provided are a diode and a manufacturing method therefor. The diode includes: a nitride channel layer; a nitride barrier layer, formed on the nitride channel layer; an oxidation forming layer, wherein a part of the oxidation forming layer is positioned in the nitride barrier layer, and a surface of the oxidation forming layer away from the nitride channel layer is flush with a surface of the nitride barrier layer away from the nitride channel layer; a passivation layer, formed on the nitride barrier layer, wherein the passivation layer includes a first groove penetrating through the passivation layer to expose the oxidation forming layer and a part of the nitride barrier layer; and a first electrode, formed in the first groove,
(Continued)

wherein the first electrode is in contact with the nitride barrier layer and the oxidation forming layer.

15 Claims, 4 Drawing Sheets

(51) Int. Cl.
  *H10D 8/01* (2025.01)
  *H10D 8/60* (2025.01)
  *H10D 62/824* (2025.01)
  *H10D 62/85* (2025.01)
(52) U.S. Cl.
  CPC .............. *H10D 8/051* (2025.01); *H10D 8/053* (2025.01); *H10D 62/824* (2025.01); *H10D 62/8503* (2025.01)
(58) Field of Classification Search
  CPC . H01L 23/3171; H01L 23/31; H01L 23/5681; H01L 23/5386; H01L 23/538; H01L 29/2003; H01L 29/20; H01L 29/205; H01L 29/66212; H01L 29/66; H01L 29/66219; H01L 29/064; H01L 29/861; H01L 29/872; H01L 23/3178; H10D 8/60; H10D 8/051; H10D 8/01; H10D 8/053; H10D 8/00; H10D 62/824; H10D 62/8503; H10D 62/85; H10D 62/115
  See application file for complete search history.

(56) References Cited

FOREIGN PATENT DOCUMENTS

| | | |
|---|---|---|
| CN | 103985767 A | 8/2014 |
| CN | 104538300 A | 4/2015 |
| CN | 211182216 U | 8/2020 |

OTHER PUBLICATIONS

ISA State Intellectual Property Office of the People's Republic of China, Written Opinion of the International Searching Authority Issued in Application No. PCT/CN2020/125419, Jan. 27, 2021, WIPO, 6 pages. (Submitted with Machine/Partial Translation).

* cited by examiner

DIODE AND MANUFACTURING METHOD THEREFOR

CROSS REFERENCE TO RELATED APPLICATIONS

This application is a national phase entry of International Patent Application No. PCT/CN2020/125419 (filed 30-October-2020), which claims priority to Chinese Patent Application No. 2020200550638 filed on Jan. 10, 2020. The entire content contents of these applications are incorporated herein by reference.

TECHNICAL FIELD

The present disclosure relates to the field of semiconductor technologies, and in particular to a diode and a manufacturing method therefor.

BACKGROUND

Due to high switching frequency and low forward voltage drop and the like, diodes are widely applied and gradually replace silicon applied on high power semiconductor devices. Generally, a first electrode of a diode is directly formed on a heterogeneous structure layer, such that the heterogeneous structure layer has large leakage characteristics in a high temperature environment.

SUMMARY

The present disclosure provides a diode and a manufacturing method therefor to solve the deficiencies of the related art.

According to a first aspect of embodiments of the present disclosure, provided is a diode, including:

a nitride channel layer;

a nitride barrier layer, formed on the nitride channel layer;

an oxidation forming layer, wherein a part of the oxidation forming layer is positioned in the nitride barrier layer;

a passivation layer, formed on the nitride barrier layer, wherein the passivation layer comprises a first groove penetrating through the passivation layer to expose the oxidation forming layer and a part of the nitride barrier layer; and a first electrode, formed in the first groove, wherein the first electrode is in contact with the nitride barrier layer and the oxidation forming layer.

Optionally, the oxidation forming layer comprises a first oxidation forming layer and a second oxidation forming layer, and the first oxidation forming layer and the second oxidation forming layer are separated from each other.

Optionally, the first groove partially enters into the nitride barrier layer without penetrating through the nitride barrier layer.

Optionally, the oxidation forming layer is formed by autoxidation of the nitride barrier layer.

Optionally, the oxidation forming layer includes aluminum nitride, aluminum oxide, gallium nitride or gallium oxide.

Optionally, the diode further includes:

a second groove and a third groove, wherein the second groove and the third groove both penetrate through the passivation layer to the nitride barrier layer, and the first groove is positioned between the second groove and the third groove; and a second electrode, formed in the second groove and the third groove.

Optionally, the second groove and the third groove both further penetrate through the nitride barrier layer to the nitride channel layer.

Optionally, the passivation layer comprises a nitride passivation layer.

Optionally, the diode further includes:

a substrate, stacked with the nitride channel layer, wherein the nitride channel layer is positioned between the substrate and the nitride barrier layer.

Optionally, the substrate comprises one or more of silicon, sapphire or silicon carbide.

According to a second aspect of embodiments of the present disclosure, provided is a method of manufacturing a diode, including:

forming a nitride channel layer;

forming a nitride barrier layer on the nitride channel layer;

forming a passivation layer on the nitride barrier layer;

forming a fourth groove and a fifth groove in the passivation layer, wherein the fourth groove and the fifth groove both penetrate through the passivation layer to the nitride barrier layer;

performing autoxidation on a structure to be processed in which the fourth groove and the fifth groove are formed, so as to form a first oxidation forming layer and a second oxidation forming layer respectively in regions corresponding to the fourth groove and the fifth groove on the nitride barrier layer;

forming a first groove penetrating through the passivation layer to expose the oxidation forming layer and a part of the nitride barrier layer; and forming a first electrode in the first groove, wherein the first electrode is in contact with the first oxidation forming layer, the second oxidation forming layer and the nitride barrier layer.

Optionally, forming the first groove includes: removing the passivation layer between the fourth groove and the fifth groove to form the first groove.

Optionally, forming the first groove includes: removing the passivation layer between the fourth groove and the fifth groove and the nitride barrier layer between the first oxidation forming layer and the second oxidation forming layer to form the first groove; wherein a bottom of the first groove is flush with bottoms of the first oxidation forming layer and the second oxidation forming layer.

Optionally, the method further includes: forming a second groove and a third groove, wherein the first groove is positioned between the second groove and the third groove; and forming a second electrode in the second groove and the third groove.

Optionally, the second groove and the third groove both penetrate through the passivation layer to the nitride barrier layer, and the second electrode formed in the second groove and the third groove is in contact with the nitride barrier layer.

Optionally, the second groove and the third groove both penetrate through the passivation layer and the nitride barrier layer to the nitride channel layer, and the second electrode formed in the second groove and the third groove is in contact with the nitride barrier layer and the nitride channel layer.

The technical solution provided by the embodiments of the present disclosure may include the following beneficial effects:

In the present disclosure, there is the oxidation forming layer between the first electrode and a heterogeneous structure including the nitride channel layer and the nitride barrier layer, so as to prevent the first electrode from being directly formed on the heterostructure layer, to balance a contradiction of a forward turn-on voltage and a reverse leakage characteristic of the diode and inhibit the leakage characteristic of the heterostructure layer in a high temperature environment.

It should be understood that the above general descriptions and subsequent detailed descriptions are merely illustrative and explanatory rather than limiting of the present disclosure.

BRIEF DESCRIPTION OF THE DRAWINGS

The accompanying drawings, which are incorporated in and constitute a part of the present description, illustrate embodiments consistent with the present disclosure and serve to explain the principles of the present disclosure together with the description.

DETAILED DESCRIPTION OF THE EMBODIMENTS

Figure 1:
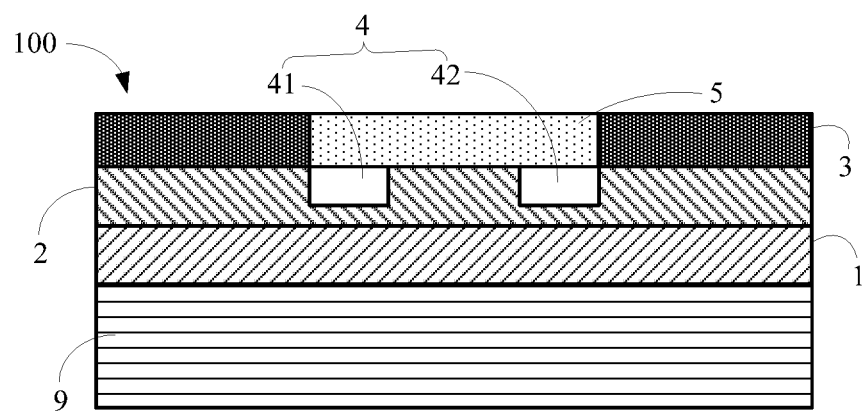
FIG. 1 is a structural schematic diagram illustrating a diode according to an embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. Terms "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

FIG. 1 is a structural schematic diagram illustrating a diode 100 according to an embodiment of the present disclosure. As shown in FIG. 1, the diode 100 may include a nitride channel layer 1, a nitride barrier layer 2, a passivation layer 3, an oxidation forming layer 4 and a first electrode 5. Wherein, the nitride barrier layer 2 is formed on the nitride channel layer 1, a part of the oxidation forming layer 4 is positioned in the nitride barrier layer 2, and a surface of the oxidation forming layer 4 away from the nitride channel layer 1 is flush with a surface of the nitride barrier layer 2 away from the nitride channel layer 1, and the oxidation forming layer 4 may be an oxynitride layer or an oxide layer. The passivation layer 3 is formed on the nitride barrier layer 2, and the passivation layer 3 includes a first groove that penetrates through the passivation layer 3 to expose the oxidation forming layer 4 and a part of the nitride barrier layer 2. The first electrode 5 is formed in the first groove and is in contact with a heterostructure layer including the nitride barrier layer 2 and the oxidation forming layer 4. Since the first electrode 5 is not directly formed on the heterostructure layer, a contradiction of a forward turn-on voltage and a reverse leakage characteristic of the diode 100 is balanced, and the leakage characteristic of the heterostructure layer in a high temperature environment is inhibited.

Wherein, the nitride channel layer 1 may be made of one or more of GaN or AlN, and the nitride barrier layer 2 may be made of one or more of AlN, GaN or InN, which is not limited herein. The oxidation forming layer 4 may be formed in the nitride barrier layer 2 by performing high temperature autoxidation on the nitride barrier layer 2. That is, the change of the material of the nitride barrier layer 2 causes the material of the oxidation formation layer 4 to be changed accordingly. In an embodiment, when the nitride barrier layer 2 is made of AlN, the oxidation forming layer 4 made of AlON may be obtained by performing high temperature autoxidation on the nitride barrier layer 2. In another embodiment, when the nitride barrier layer 2 is made of GaN, the oxidation forming layer 4 made of GaON may be obtained by performing high temperature autoxidation on the nitride barrier layer 2.

Furthermore, since the oxidation forming layer 4 is formed by performing high temperature autoxidation on the nitride barrier layer 2, a thickness of the oxidation forming layer 4 formed in the nitride barrier layer 2 is smaller than that of the nitride barrier layer 2. The autoxidation of the nitride barrier layer 2 may be performed with oxygen or ozone, which is not limited herein.

In an embodiment, the passivation layer 3 may include a nitride passivation layer, the passivation layer 3 may be formed on the nitride barrier layer 2 by a deposition process. the process of depositing the passivation layer 3 may be one or more of PECVD (Plasma Enhanced Chemical Vapor Deposition), LPCVD (Low Pressure Chemical Vapor Deposition), ALD (Atomic Layer Deposition) or MOCVD (Metal-organic Chemical Vapor Deposition). For example, the passivation layer 3 may include SiN, and SiN may be deposited on the nitride barrier layer 2 through the PECVD, the LPCVD, the ALD, the MOCVD and other processes. Wherein, the first groove may be formed by an etching process, for example, a dry etching process or a wet etching process, which is not limited herein. The first electrode 5 may be made of a metal material, such as Ni, Au or Pt, which is not limited herein.

In this embodiment, still shown in FIG. 1, the oxidation forming layer 4 may include a first oxidation forming layer 41 and a second oxidation forming layer 42. The first oxidation forming layer 41 and the second oxidation forming layer 42 are separated from each other, that is, the first oxidation forming layer 41 and the second oxidation forming layer 42 are spaced by a part of the nitride barrier layer 2.

Figure 2:
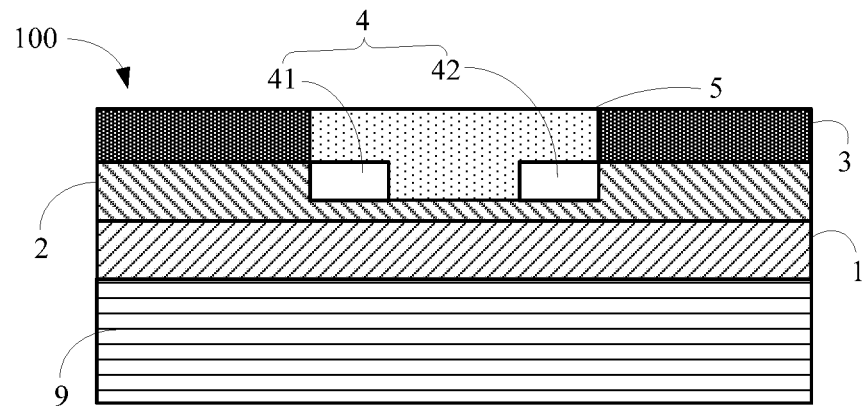
FIG. 2 is a structural schematic diagram illustrating another diode according to an embodiment of the present disclosure.

In another embodiment, as shown in FIG. 2, the first groove of the passivation layer 3 may partially enter into the nitride barrier layer 2 without penetrating through the nitride barrier layer 2. The first electrode 5 deposited in the first groove is in contact with the first oxidation forming layer 41, the second oxidation forming layer 42 and the nitride barrier layer 2.

In each of the above-mentioned embodiments, as shown in FIG. 1, the diode 100 may further include a substrate 9, which is stacked with the nitride channel layer 1, and the nitride channel layer 1 is positioned on the substrate 9, and the nitride channel layer 1 is positioned between the substrate 9 and the nitride barrier layer 2. Wherein, the substrate 9 may be made of one or more of silicon, sapphire or silicon carbide, which is not limited herein.

Figure 3:
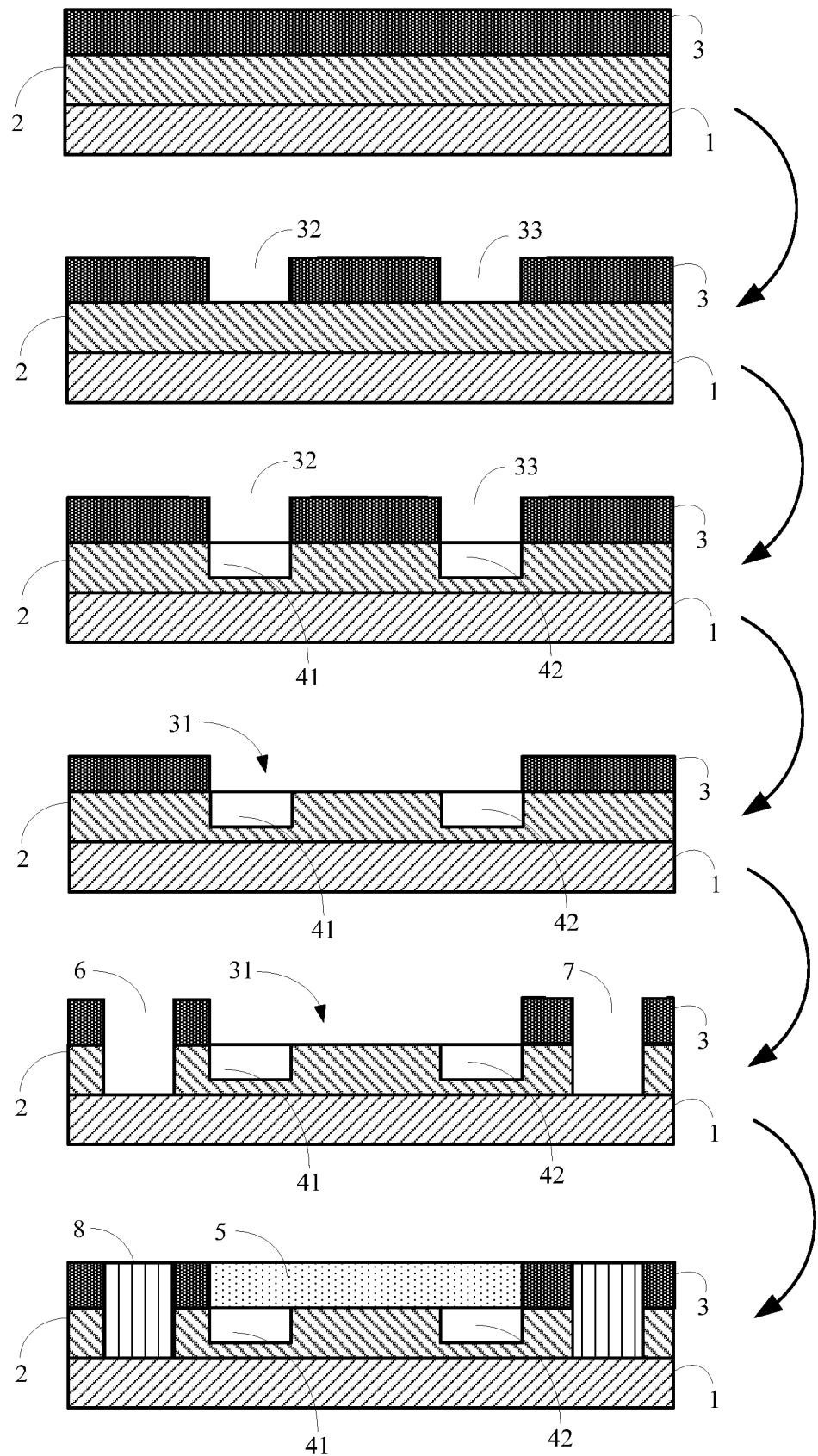
FIG. 3 is a flowchart illustrating a manufacturing process of a diode according to an embodiment of the present disclosure.

The present disclosure further provides a process flow for manufacturing the diode 100. As shown in FIG. 3, a nitride channel layer 1 and a nitride barrier layer 2 may be formed by stacking in sequence, and then a passivation layer 3 is deposited on the nitride barrier layer 2, and then a fourth groove 32 and a fifth groove 33 both of which penetrate through the passivation layer 3 to the nitride barrier layer 2 are formed in the passivation layer 3. The to-be-processed structure is placed in an ozone or oxygen atmosphere for high temperature autoxidation, a first oxidation forming layer 41 and a second oxidation forming layer 42 are obtained. Due to the blocking effect of the passivation layer 3, no oxidation forming layer is formed in regions other than the fourth groove 32 and the fifth groove 33.

Further, in an embodiment, the passivation layer between the fourth groove 32 and the fifth groove 33 is removed to obtain a first groove 31, and a first electrode 5 is formed in the first groove 31, the structure shown in FIG. 1 is obtained. In another embodiment, the passivation layer between the fourth groove 32 and the fifth groove 33 is removed, and the nitride barrier layer 2 between the first oxidation forming layer 41 and the second oxidation formation layer 42 is removed, so that a first groove 31 is obtained. A bottom of the first groove 31 is flush with bottoms of the first oxidation forming layer 41 and the second oxidation forming layer 42. Finally, a first electrode 5 is formed in the first groove 31, and the structure shown in FIG. 2 is obtained. The second groove 6 and the third groove 7 are respectively formed on both sides of the first groove 31 after the first groove 31 is obtained. The first electrode 5 is formed in the first groove 31, and a second electrode 8 is formed in the second groove 6 and the third groove 7, thereby the diode 100 is obtained.

Figure 4:
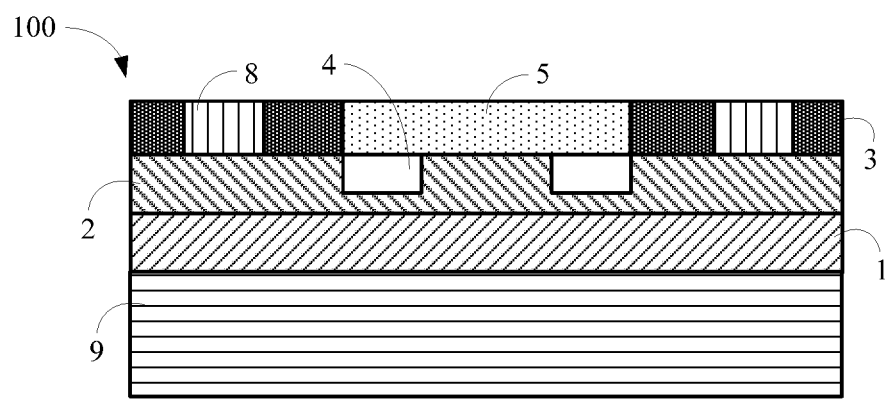
FIG. 4 is a structural schematic diagram illustrating yet another diode according to an embodiment of the present disclosure.
Figure 5:
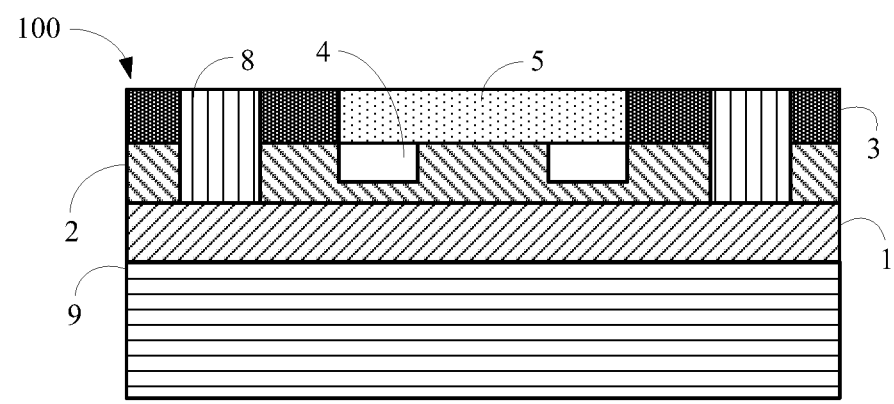
FIG. 5 is a structural schematic diagram illustrating still another diode according to an embodiment of the present disclosure.

In an embodiment, both the second groove 6 and the third groove 7 may penetrate through the passivation layer 3 to the nitride barrier layer 2, so that the second electrode 8 formed in the second groove 6 and the third groove 7 is in contact with the nitride barrier layer 2 to obtain the diode 100 as shown in FIG. 4. In another embodiment, as shown in FIG. 5, the second groove 6 and the third groove 7 may both penetrate through the passivation layer 3 and the nitride barrier layer 2 to the nitride channel layer 1, so that the second electrode 8 formed in the second groove 6 and the third groove 7 is in contact with the nitride barrier layer 2 and the nitride channel layer 1 to form an ohmic contact.

Figure 6:
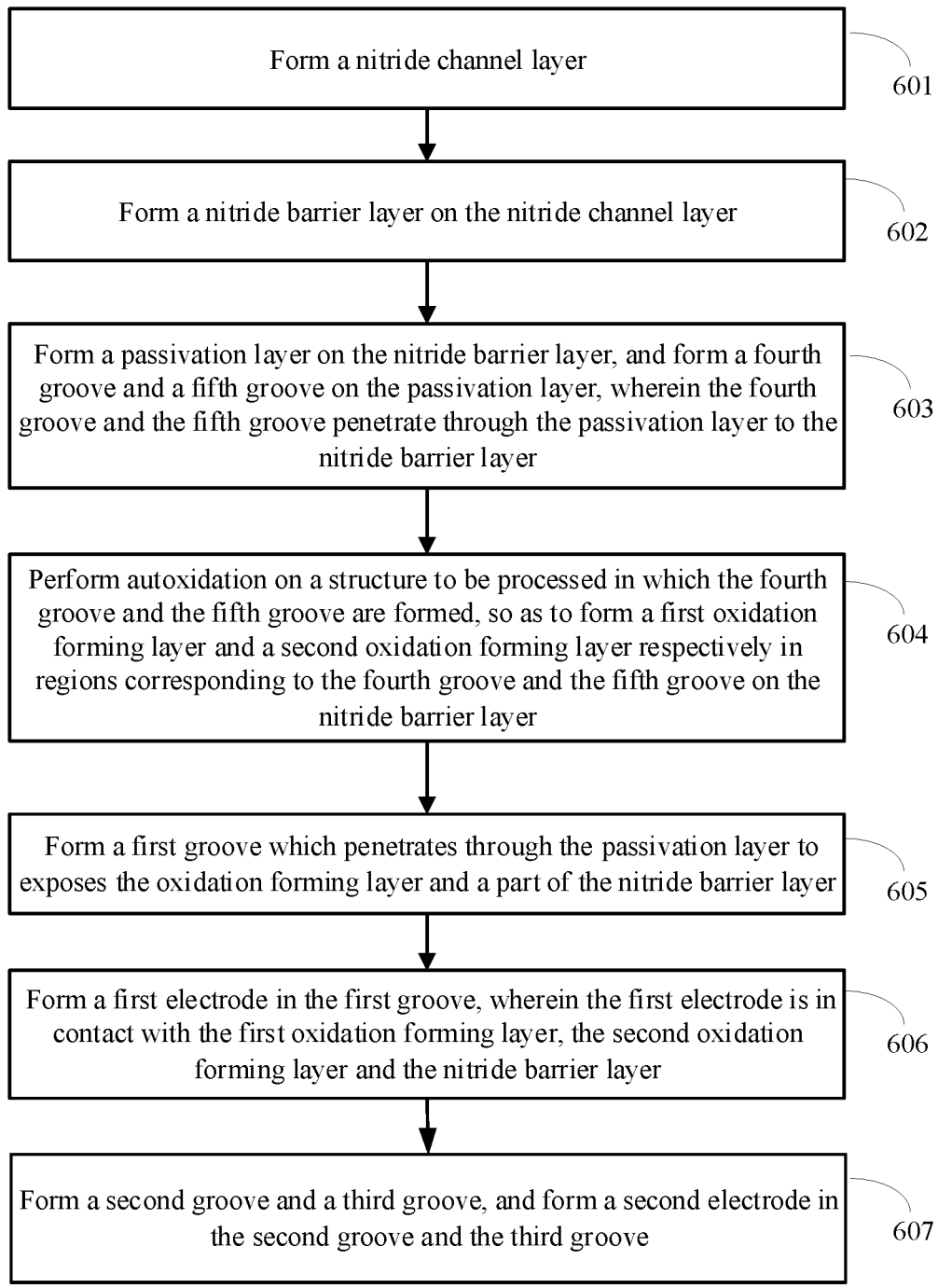
FIG. 6 is a schematic diagram illustrating a method for manufacturing diode according to an embodiment of the present disclosure.

Based on the above technical solution, the present disclosure further provides a method for manufacturing a diode, related parts of which refer to the description of the product. As shown in FIG. 6, the method may include the following steps.

At step 601, a nitride channel layer is formed.

At step 602, a nitride barrier layer is formed on the nitride channel layer.

At step 603, a passivation layer is formed on the nitride barrier layer, and a fourth groove and a fifth groove are formed on the passivation layer, wherein the fourth groove and the fifth groove penetrate through the passivation layer to the nitride barrier layer.

At step 604, autoxidation is performed on a structure to be processed in which the fourth groove and the fifth groove are formed, so as to form a first oxidation forming layer and a second oxidation forming layer respectively in regions corresponding to the fourth groove and the fifth groove on the nitride barrier layer.

At step 605, a first groove which penetrates through the passivation layer to exposes the oxidation forming layer and a part of the nitride barrier layer is formed.

In an embodiment, forming the first groove may include: removing the passivation layer between the fourth groove and the fifth groove to form the first groove, a first electrode is formed in the first groove. In another embodiment, forming the first groove may include: removing the passivation layer between the fourth groove and the fifth groove and the nitride barrier layer between the first oxidation forming layer and the second oxidation forming layer to form the first groove; wherein a bottom of the first groove is flush with bottoms of the first oxidation forming layer and the second oxidation forming layer.

At step 606, a first electrode is formed in the first groove, wherein the first electrode is in contact with the first oxidation forming layer, the second oxidation forming layer and the nitride barrier layer. Wherein, the first electrode is deposited in the first groove.

At step 607, a second groove and a third groove are formed, and a second electrode is formed in the second groove and the third groove.

In an embodiment, the second groove and the third groove both penetrate through the passivation layer to the nitride barrier layer, and the second electrode formed in the second groove and the third groove is in contact with the nitride barrier layer. In another embodiment, the second groove and the third groove both penetrate through the passivation layer and the nitride barrier layer to the nitride channel layer, and the second electrode formed in the second groove and the third groove is in contact with the nitride barrier layer and the nitride channel layer.

It should be noted that in the above-mentioned embodiments, the first electrode is first formed in the first groove as an example for exemplification. In fact, in some other embodiments, the second electrode may be formed in the second groove and the third groove first, and then the first electrode is formed in the first groove. The order of formation of the electrodes is not limited.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and embodiments are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A diode, comprising:
   a nitride channel layer;
   a nitride barrier layer, formed on the nitride channel layer;
   an oxidation forming layer, wherein a part of the oxidation forming layer is positioned in the nitride barrier layer;
   a passivation layer, formed on the nitride barrier layer, wherein the passivation layer comprises a first groove penetrating through the passivation layer to expose the oxidation forming layer and a part of the nitride barrier layer;
   a first electrode, formed in the first groove, wherein the first electrode is in contact with the nitride barrier layer and the oxidation forming layer;
   a second groove and a third groove, wherein the second groove and the third groove both penetrate through the passivation layer to the nitride barrier layer, and the first groove is positioned between the second groove and the third groove; and
   a second electrode, formed in the second groove and the third groove.

2. The diode of claim 1, wherein the oxidation forming layer comprises a first oxidation forming layer and a second oxidation forming layer, and the first oxidation forming layer and the second oxidation forming layer are separated from each other.

3. The diode of claim 1, wherein the first groove partially enters into the nitride barrier layer without penetrating through the nitride barrier layer.

4. The diode of claim 1, wherein the oxidation forming layer is formed by autoxidation of the nitride barrier layer.

5. The diode of claim 1, wherein the oxidation forming layer comprises aluminum nitride, aluminum oxide, gallium nitride or gallium oxide.

6. The diode of claim 1, wherein the second groove and the third groove both further penetrate through the nitride barrier layer to the nitride channel layer.

7. The diode of claim 1, wherein the passivation layer comprises a nitride passivation layer.

8. The diode of claim 1, further comprising:
   a substrate, stacked with the nitride channel layer, wherein the nitride channel layer is positioned between the substrate and the nitride barrier layer.

9. The diode of claim 8, wherein the substrate comprises one or more of silicon, sapphire or silicon carbide.

10. A method of manufacturing a diode, comprising:
    forming a nitride channel layer;
    forming a nitride barrier layer on the nitride channel layer;
    forming a passivation layer on the nitride barrier layer;
    forming a fourth groove and a fifth groove in the passivation layer, wherein the fourth groove and the fifth groove both penetrate through the passivation layer to the nitride barrier layer;
    performing autoxidation on a structure to be processed in which the fourth groove and the fifth groove are formed, so as to form a first oxidation forming layer and a second oxidation forming layer respectively in regions corresponding to the fourth groove and the fifth groove on the nitride barrier layer;
    forming a first groove penetrating through the passivation layer to expose the first oxidation forming, the second oxidation forming layer and a part of the nitride barrier layer; and
    forming a first electrode in the first groove, wherein the first electrode is in contact with the first oxidation forming layer, the second oxidation forming layer and the nitride barrier layer.

11. The method of claim 10, wherein forming the first groove comprises:
    removing the passivation layer between the fourth groove and the fifth groove to form the first groove.

12. The method of claim 10, wherein forming the first groove comprises:
    removing the passivation layer between the fourth groove and the fifth groove and the nitride barrier layer between the first oxidation forming layer and the second oxidation forming layer to form the first groove;
    wherein a bottom of the first groove is flush with bottoms of the first oxidation forming layer and the second oxidation forming layer.

13. The method of claim 10, further comprising:
    forming a second groove and a third groove, wherein the first groove is positioned between the second groove and the third groove; and
    forming a second electrode in the second groove and the third groove.

14. The method of claim 13, wherein the second groove and the third groove both penetrate through the passivation layer to the nitride barrier layer, and the second electrode formed in the second groove and the third groove is in contact with the nitride barrier layer.

15. The method of claim 13, wherein the second groove and the third groove both penetrate through the passivation layer and the nitride barrier layer to the nitride channel layer, and the second electrode formed in the second groove and the third groove is in contact with the nitride barrier layer and the nitride channel layer.

* * * * *